United States Patent [19]
Okamoto et al.

[11] Patent Number: 5,521,438
[45] Date of Patent: May 28, 1996

[54] CERAMIC BASE AND METALLIC MEMBER ASSEMBLY

[75] Inventors: Naoyuki Okamoto; Kazunori Miura, both of Nagoya, Japan

[73] Assignee: NGK Spark Plug Co., Ltd., Nagoya, Japan

[21] Appl. No.: 311,053

[22] Filed: Sep. 23, 1994

[30] Foreign Application Priority Data

Sep. 24, 1993 [JP] Japan ................... 5-261527

[51] Int. Cl.$^6$ ................... H01L 23/06; H01L 23/10; H01L 23/15; H01L 23/12
[52] U.S. Cl. ................... 257/703; 257/701; 257/779; 257/766
[58] Field of Search ................... 257/701, 702, 257/703, 705, 779, 780, 781, 766

[56] References Cited

U.S. PATENT DOCUMENTS

| | | | |
|---|---|---|---|
| 4,352,120 | 9/1982 | Kurihara et al. | 257/705 |
| 4,554,575 | 11/1985 | Lucas | 257/779 |
| 4,556,899 | 12/1985 | Kurihara et al. | 257/701 |
| 5,019,554 | 5/1991 | Takeshita et al. | 257/702 |

FOREIGN PATENT DOCUMENTS

| | | |
|---|---|---|
| 64-1268 | 1/1989 | Japan . |
| 3-160750 | 7/1991 | Japan . |
| 4-64466 | 10/1992 | Japan . |

*Primary Examiner*—Sara W. Crane
*Assistant Examiner*—S. V. Clark
*Attorney, Agent, or Firm*—Foley & Lardner

[57] ABSTRACT

In a ceramic base and metallic member assembly, a metallic member such as an input/output terminal is joined by solder to a ceramic base substrate by way of a stress relief layer. The ceramic base substrate has a metallized layer on which the stress relief layer is formed by plating. The stress relief layer is made of soft metal such as copper and has the thickness equal to or larger than 25 μm. In one embodiment, a barrier made of glass or an organic insulating material for preventing outflow of solder is formed on a peripheral portion of a joining surface of the stress relief layer.

20 Claims, 6 Drawing Sheets

CERAMIC BASE AND METALLIC MEMBER ASSEMBLY

BACKGROUND OF THE INVENTION

1. Field of the Invention

The present invention relates in general to soldering or brazing for joining a ceramic member metallic member together and more particularly to a ceramic base and metallic member assembly for electronic devices, including a ceramic base substrate and a metallic member such as an I/O (input/output) terminal, a seal ring, etc. joined to the ceramic base substrate with solder.

2. Description of the Prior Art

Alumina substrates (thermal expansion coefficient $\alpha = 6.8 \times 10^{-6}/°C.$) have heretofore been used for most IC (integrated circuit) packages for accommodating therewithin and hermetically sealing a semiconductor chip or chips. Metallic members such as I/O terminals and a seal ring are joined to the ceramic substrate by first forming a thick film or thin film metallized layer on the ceramic substrate and then joining the metallic members made of kovar (trademark, 29%Ni—17%Co—Fe alloy; $\alpha = 4.7 \times 10^{-6}/°C.$) or 42 alloy (42%Ni—Fe alloy; the metallized layer with silver solder (eutectic Ag solder, etc.).

However, in view of the recent trend of rising signal frequencies and the development of larger power chips, the alumina substrate is encountered by a problem that since its dielectric constant is relatively large the electrostatic capacitance in the signal line becomes so large as to cause delay in signal propagation or the chip is subjected to a thermal stress due to the difference in thermal expansion coefficient between the alumina substrate and the silicon semiconductor chip ($\alpha = 3.0 \sim 3.5 \times 10^{-6}/°C.$).

In order to meet with the requirement for a high density and high speed in operation of semiconductor devices in an IC package, glass ceramic ($\alpha = 1.5 \sim 5.0 \times 10^{-6}/°C.$), aluminium nitride ($\alpha = 4.4 \times 10^{-6}/°C.$), mullite ($\alpha = 3.8 \times 10^{-6}/°C.$), etc., which feature to be low in dielectric constant and approximate in thermal expansion coefficient to a silicon semiconductor chip, have been examined with a view to substituting for alumina.

While these materials approximate in thermal expansion coefficient to the silicon semiconductor chip, they are lower in strength as compared with alumina ceramic, so that a crack or cracks are liable to occur at or adjacent the joining portion due to the difference in thermal expansion coefficient between the ceramic substrate and the silicon semiconductor chip.

Further, the thermal stress caused in the ceramic base by soldering or brazing is a compression stress when the metallic member is smaller in thermal expansion coefficient than the ceramic substrate and reversely a tensile stress when the metallic member is larger in thermal expansion coefficient than the ceramic substrate.

In general, ceramic is strong against a compression stress but weak against a tensile stress. This will turn out a disadvantage in case ceramic, which is low in thermal expansion coefficient, is joined to a metallic member.

As described above, it has been impossible to attain good joining of the ceramic substrate and the metallic member when glass ceramic, etc. is used for the ceramic substrate.

In this connection, JP-B-4-64466 (publication of Japanese patent application after examination) discloses to solve the above problem by forming a stress relief layer made up of copper, iron, etc. and having the thickness of 1~20 μm, preferably about 6 μm on the joining layer affixed to the ceramic substrate.

Further, JP-A-64-1268 (publication of Japanese patent application before examination) discloses that it is possible to join I/O terminals to a metallized layer on a ceramic substrate at a relatively low temperature with solder containing copper.

However, with such a stress relief layer as disclosed in JP-B-4-64466, a desired standard defining the joining strength between a ceramic substrate and a metallic member such as an I/O terminal could not be satisfied. Further, the invention disclosed by JP-B-4-64466 is directed to Au—Sn soldering which is a low temperature soldering.

Generally, after the ceramic substrate has joined thereto I/O terminals, etc., soldering is further performed to attach a semiconductor device to the ceramic substrate. Still further, soldering is performed to attach a lid to the ceramic substrate for thereby hermetically sealing the package.

Accordingly, the higher the temperature at which I/O terminals, etc. are joined by solder or brazing metal to a ceramic substrate becomes, the larger the freedom in the subsequent soldering processes becomes. This is desirable since the handling of the substrate can be easier. However, by brazing with silver solder (about 800~900° C.) which is usually used as high temperature soldering or brazing, the standard of the joining strength can not be satisfied.

JP-A-64-1268 discloses a ceramic base and metallic member assembly in which the thermal expansion coefficient of the ceramic is relatively large (supposed to be $\alpha = 5.5 \times 10^{-6}/°C.$ or so). However, in case the ceramic for the base was smaller in thermal expansion coefficient ($\alpha \leq 5.0 \times 10^{-6}/°C.$), the joining strength defined in the above described standard could not be attained by only joining with solder containing copper, which is represented by silver solder (e.g., 72Ag-28Cu solder).

SUMMARY OF THE INVENTION

According to an aspect of the present invention, there is provided a ceramic base which comprises a ceramic base substrate made of a ceramic material having a thermal expansion coefficient equal to or smaller than $5 \times 10^{-6}/°C.$, a metallized layer formed on the ceramic base substrate, and a stress relief layer made of soft metal, formed on the metallized layer and having the thickness equal to or larger than 25 μm.

According to a further aspect of the present invention, the ceramic base further comprises a nickel layer formed on the stress relief layer.

According to a further aspect of the present invention, there is provided a ceramic base and metallic member assembly which comprises a ceramic base substrate made of a ceramic material having a thermal expansion coefficient equal to or smaller than $5 \times 10^{-6}/°C.$, a metallized layer formed on the ceramic base substrate, a stress relief layer made of soft metal, formed on the metallized layer and having the thickness equal to or larger than 25 μm, a solder layer formed on the stress relief layer, and a metallic member joined by the solder layer to the stress relief layer.

According to a further aspect of the present invention, a barrier for preventing outflow of solder is formed on a peripheral portion of a joining surface of the stress relief layer. The barrier is made of glass or an organic insulating material According to a further aspect of the present invention, the stress relief layer is formed by plating.

According to a further aspect of the present invention, the metallic member is an input/output terminal.

According to a further aspect of the present invention, the metallic member is a seal ring.

According to a further aspect of the present invention, the ceramic base and metallic member assembly is for an electronic device.

According to a further aspect of the present invention, the thickness of the stress relief layer is within the range from 25 to 100 μm.

According to a further aspect of the present invention, the thickness of the stress relief layer is within the range from 50 to 100 μm.

The above structure is effective for solving the above noted problems inherent in the prior art device.

It is accordingly an object of the present invention to provide a novel and improved ceramic base and metallic member assembly for electronic devices which makes it possible to join the metallic member to the ceramic base not only by low temperature soldering but by high temperature soldering such as brazing with silver solder, etc., by which high temperature soldering a sufficient joining strength cannot be attained according to the prior art.

It is a further object of the present invention to provide a novel and improved ceramic base and metallic member assembly of the foregoing character which makes it possible to join terminals and a seal ring to a ceramic base substrate with an increased joining strength and with ease and assuredness.

It is a further object of the present invention to provide a novel and improved ceramic base and metallic member assembly of the foregoing character which is highly reliable in operation though it can be manufactured with ease and at low cost.

DETAILED DESCRIPTION OF THE PREFERRED EMBODIMENTS

Figure 1A:
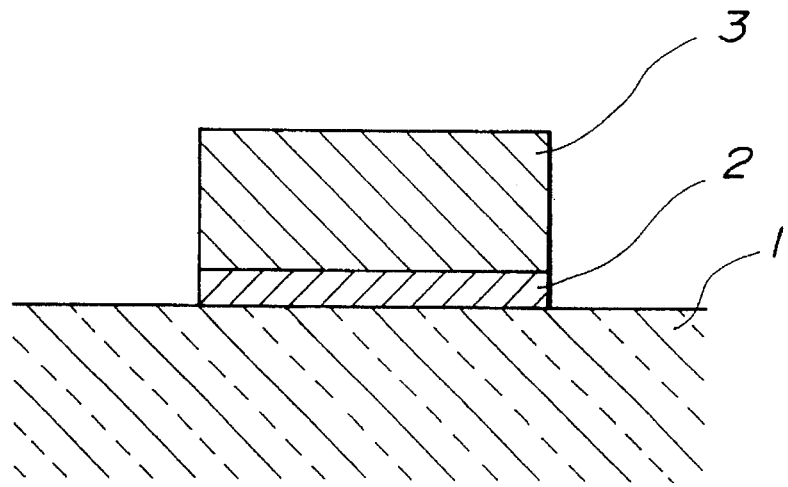
FIG. 1A is a sectional view showing in an exaggerated manner an I/O terminal attaching pad, which is formed on a ceramic substrate and is not plated with nickel.
Figure 1B:
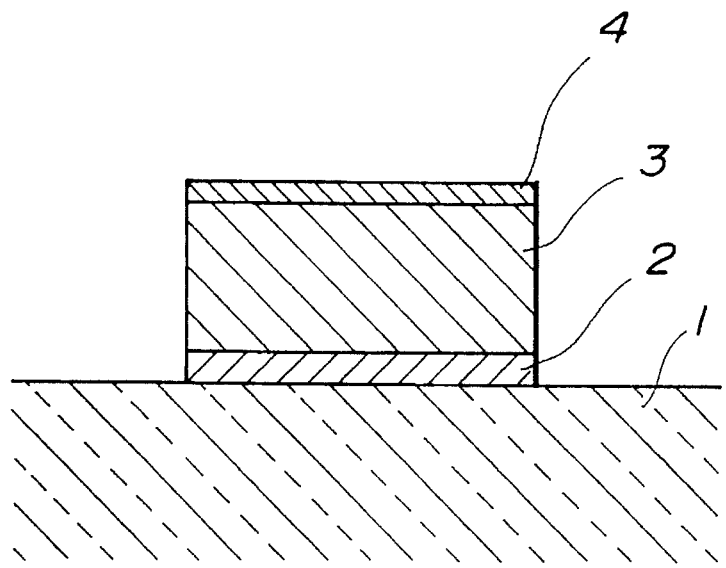
FIG. 1B is a view similar to FIG. 1A but shows the pad in a condition of being plated with nickel.
Figure 2:
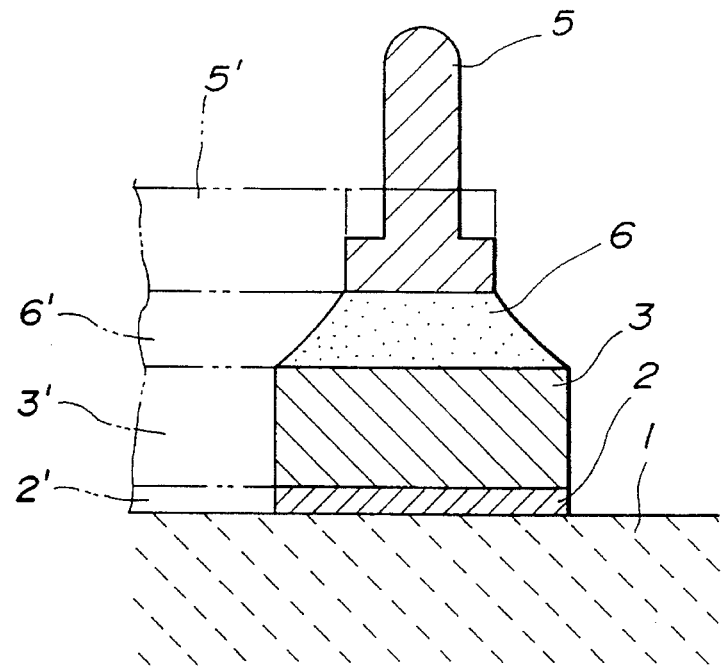
FIG. 2 is a view similar to FIG. 1 but shows the I/O terminal attaching pad in a condition of being joined by solder with an I/O terminal.
Figure 3:
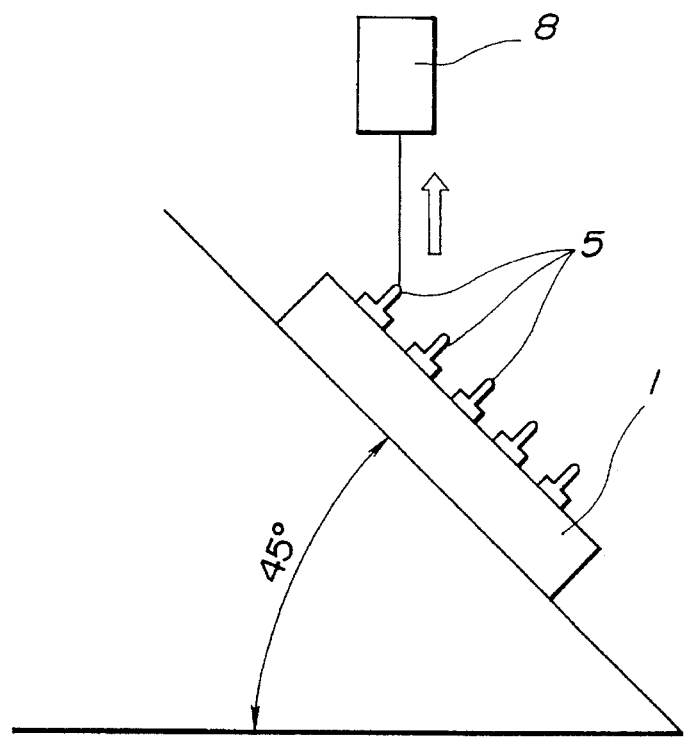
FIG. 3 is an illustration of how to carry out a tensile test for measuring a joining strength.

Referring to FIGS. 1 to 3, a ceramic base for an electronic device according to an embodiment of the present invention includes a ceramic base substrate 1, the ceramic material of which is glass ceramic, and a Ti—Mo—Cu thin film metallized layer 2 formed on the base substrate 1. The metallized layer 2 is plated with copper and has formed thereon a stress relief layer 3. An I/O (input/output) terminal 5, which is one of metallic members to be attached to the base substrate 1, is joined with solder or brazing metal 6 to the stress relief layer 3 as shown in FIG. 2.

Various samples of this embodiment which are different in solder (or brazing metal) and soldering (or brazing) temperature (i.e., the temperature at which soldering is performed), which are different in the material of I/O terminal, and which are different in thermal expansion coefficient of glass ceramic, were produced and tested for the effect by changing the thickness of the stress relief layer 3.

The samples were produced in the following manner.

Firstly, a thin film of Ti(0.2 μm)-Mo(0.3 μm)-Cu(0.5 μm) is formed on the ceramic substrate 1 made of glass-ceramic ($\alpha=3.0\times10^{-6}/°C$.) in the order of Ti, Mo and Cu by spattering and then formed into a predetermined shape of the metallized layer 2 by being partly removed from the ceramic substrate 1 by photolithography. The metallized layer 2 is circular in shape and sized to be 2.2 mm in diameter.

Thereafter, the metallized layer 2 is plated with copper, and the stress relief layer 3 is formed on the metallized layer 2. In the above manner, a sample for attaching or mounting of an I/O terminal is produced. An assembly of the metallized layer 2 and the stress relief layer 3 is herein called an I/O terminal attaching pad.

In the meantime, the stress relief layer 3 may be soldered or brazed to the metallized layer 2 after formed with a nickel layer 4 by plating, etc. as shown in FIG. 1B.

The nickel layer 4 is desirable since it protects the top face of the stress relief layer 3 from oxidation during a soldering process whilst effecting a good wettability relative to solder.

Further, the Au(gold), Ag(silver) and Cu(copper), etc. contained in the solder 6 is quite easily diffused with the Cu(copper) contained in the stress relief layer 3. Due to this, the Cu(copper) contained in the stress relief layer 3 may be fused into the solder 6 to change the composition of the solder 6 largely, whereby to undesiredly vary the melting point, hardness and strength of the solder 6. In contrast to this, the Ni(nickel) layer 4 can serve as a barrier layer for preventing the Cu(copper) contained in the stress relief layer 3 from being excessively fused into the solder 6.

On the other hand, in case a Au(gold)-Sn(tin) alloy, Au(gold)-Si(silicon) alloy, Au(gold)-Ge(germanium) alloy, or the like is used as solder, the constituents (Sn, Si, Ge, etc.) other than Au react with the Ni of the Ni plating to form brittle intermetallic compounds. By this, although it may be considered that a layer of intermetallic compounds may be formed to reduce the joining strength, the Ni and the intermetallic compounds are actually diffused and distributed at or adjacent the interface of the solder and the stress relief layer and do not form a well-defined layer, thus not producing any substantial effect on the joining strength.

In this embodiment, the Ni layer 4 is formed by plating in such a manner as to have the thickness of about 0.5~5 μm which is determined in accordance with the thickness of the stress relief layer 3.

In order to know the effects of the solder and the soldering temperature, an I/O terminal 5 (the flanged portion is 0.7 mm in diameter and the terminal portion is 0.46 mm in diameter and 3.5 mm long) was prepared and joined to the above described sample of I/O terminal attaching pad with solder 6. The terminal 5 was made of 194 alloy (2.35%Fe-0.12%Zn-0.03%P—Cu alloy), and five kinds of silver solder and gold solder were used for the test.

Soldering was performed by using a belt furnace or continuous furnace and in the atmosphere of decompositional ammonia gases (reduced atmosphere) in case a silver solder is used or in the atmosphere of open air in case a gold solder is used, and at a predetermined soldering temperature.

μm irrespective of which one of the solders is used, in order that the tensile strength of the terminal is equal to or larger than 4 Kg.

By this, it is revealed that high temperature soldering, which is represented by brazing with silver solder, other than soldering with gold solder can be used successfully for joining an I/O terminal to a ceramic substrate, provided that the stress relief layer is sized to be 25 μm or more thick.

TABLE I

| | Sample No. | Solder | Soldering Temp. (°C.) | Thickness of Cu Stress Relief Layer (μm) | Joining Strength of Terminal (Kg/Terminal) | Mode of Breakage |
|---|---|---|---|---|---|---|
| Invention | 1 | 72Ag—28Cu | 840 | 100 | 6.0 | BOT |
| | 2 | 63Ag—22Cu—15In | 775 | 100 | 4.5 | SOB |
| | 3 | 35Ag—30Cu—35In | 600 | 100 | 5.2 | SOB |
| | 4 | Au—12Ge | 450 | 100 | 6.0 | BOT |
| | 5 | Au—20Sn | 350 | 100 | 5.0 | SOB |
| | 6 | 72Ag—28Cu | 840 | 50 | 5.8 | BOT |
| | 7 | 63Ag—22Cu—15In | 775 | 50 | 4.4 | SOB |
| | 8 | 35Ag—30Cu—35In | 600 | 50 | 5.0 | SOB |
| | 9 | Au—12Ge | 450 | 50 | 5.8 | BOT |
| | 10 | Au—20Sn | 350 | 50 | 4.8 | SOB |
| | 11 | 72Ag—28Cu | 840 | 25 | 5.8 | BOT |
| | 12 | 63Ag—22Cu—15In | 775 | 25 | 4.2 | SOB |
| | 13 | 35Ag—30Cu—35In | 600 | 25 | 4.8 | SOB |
| | 14 | Au—12Ge | 450 | 25 | 5.8 | BOT |
| | 15 | Au—20Sn | 350 | 25 | 4.5 | SOB |
| Comparative Example | 16 | 72Ag—28Cu | 840 | 10 | 3.6 | SOB |
| | 17 | 63Ag—22Cu—15In | 775 | 10 | 1.4 | SOB |
| | 18 | 35Ag—30Cu—35In | 600 | 10 | 1.6 | SOB |
| | 19 | Au—12Ge | 450 | 10 | 3.0 | SOB |
| | 20 | Au—20Sn | 350 | 10 | 2.0 | SOB |

In the Table, BOT represents "Breakage of Terminal" and SOB represents "Scooping out of Base".

In order to measure the joining strength of the soldered sample, a tensile test was performed by pulling the terminal of the sample in the direction inclined 45 degrees with respect to the axis of the terminal as shown in FIG. 3 and at the speed of 20 mm/sec, so that the joining strength per one terminal was measured and compared with that of another terminal. In this connection, ten samples were prepared per each kind, and the joining strength is an average value. The test result concerning the relation between the thickness of the stress relief layer and the joining strength is shown in Table I.

Figure 4:
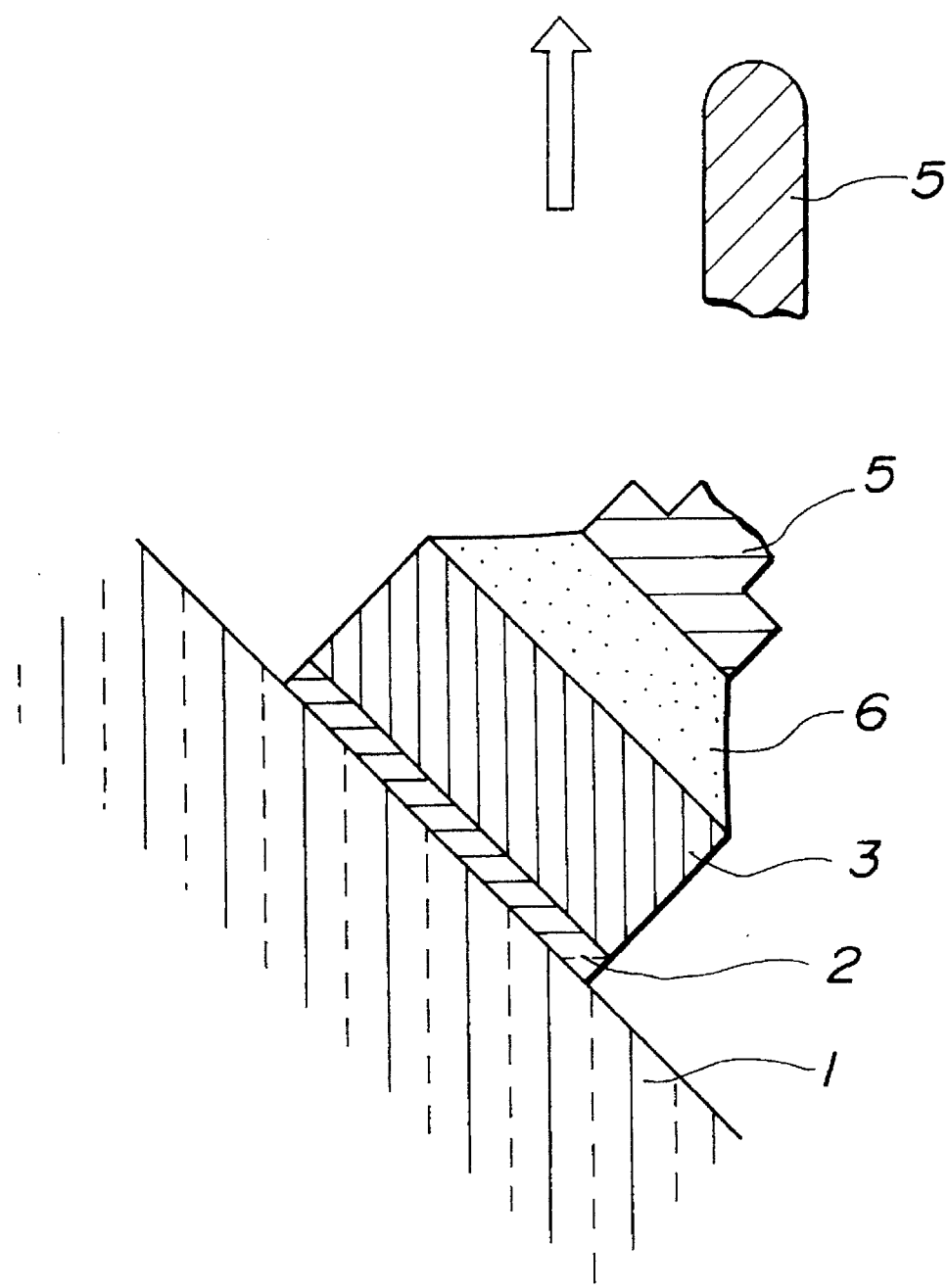
FIG. 4 is an illustration of "breakage of terminal" as a result of a tensile test.
Figure 5:
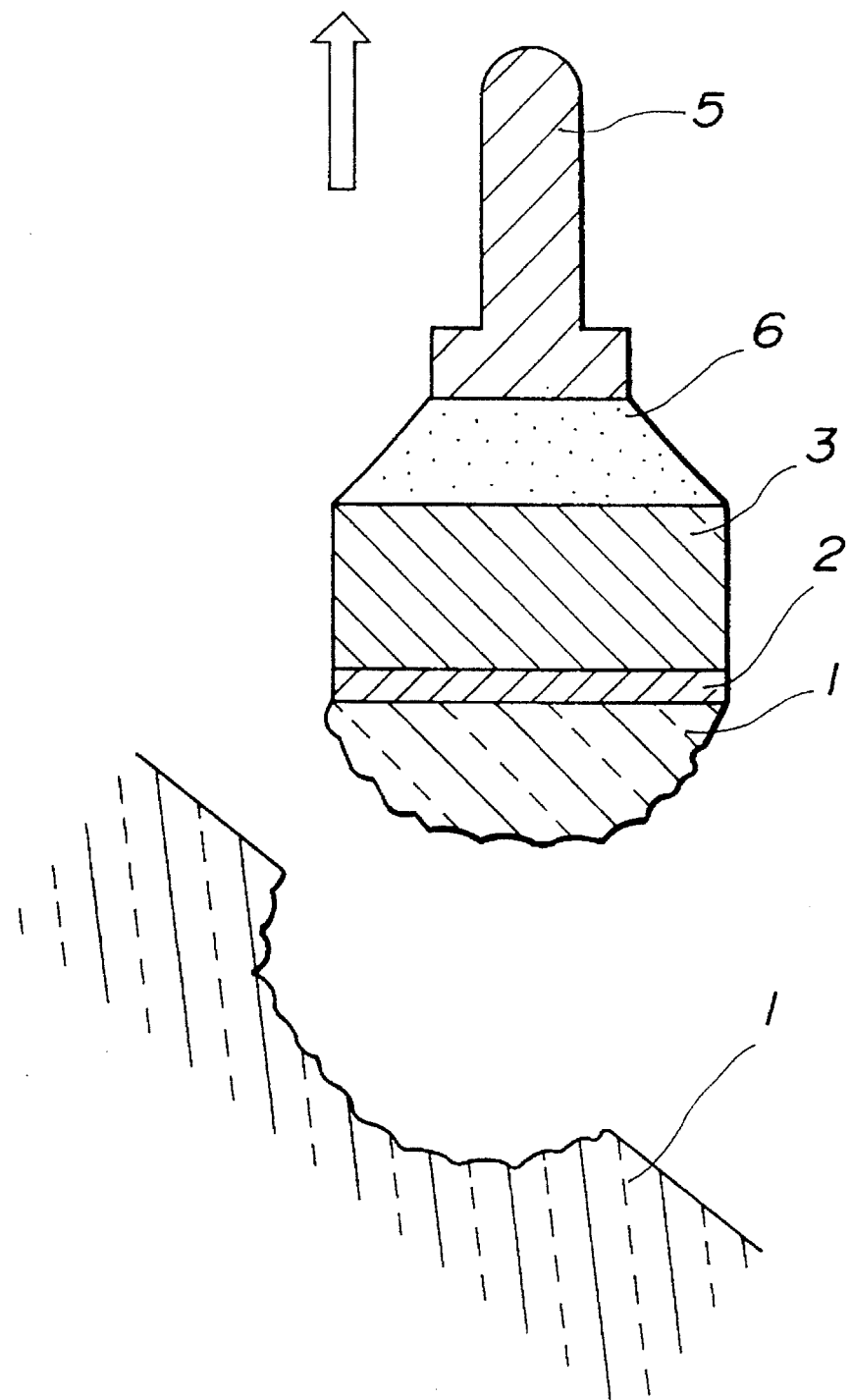
FIG. 5 is an illustration of "scooping out of base" as a result of a tensile test.

In this connection, "Breakage of Terminal" in the section of mode of breakage of Table I indicates that during the tensile test the terminal was broken due to the fact that the joining strength was larger than the tensile strength of the terminal of itself as shown in FIG. 4. On the other, "Scooping out of Base" indicates that a crack or cracks was caused at a portion of the ceramic base just under the metallized layer and the base was scooped out as shown in FIG. 5.

In case of the terminal of this shape and size, a standard value of a normally required tensile strength is 4 kg/terminal.

The terminal 5 made of 194 alloy has a tensile strength of about 5.8~6 kg, so that when the joining strength is larger than the tensile strength "Breakage of Terminal" occurs. Accordingly, in case the mode of breakage is "Breakage of Terminal", the joining strength is further larger.

From Table I, it will be understood that the thickness of the stress relief layer needs to be equal to or larger than 25

The samples of sample Nos. 16 ~20 correspond to the prior art articles and cannot attain the above described desired joining strength since the stress relief layer 3 is so thin as to be 10 μm.

Further, the joining strength becomes larger as the stress relief layer becomes thicker. From this, it will be understood that the stress relief layer is effective for relieving the stress caused by soldering.

In the meantime, it is considered that there may be some relation between the joining strength and the soldering temperature, but since such factors as the hardness, thermal expansion coefficient, etc. of solder exist between them, the relation is not clear.

For example, since solder added with indium (In) becomes higher in hardness and thermal expansion coefficient, the joining strength obtained by the use of solder added with indium is smaller than that by the use of normal silver solder of 72Ag-28Cu though the brazing temperature in case of use of solder added with indium is lower than that in case of use of normal silver solder of 72Ag-28Cu.

Then, in order to know the effects caused by the difference of the metallic material, the terminals 5 of different materials were prepared and soldered to the base and subjected to a tensile test similar to the above to know the relation between the thickness of the stress relief layer and the joining strength. The terminal were formed from four materials, i.e., kovar (Fe—Ni—Co alloy), 42 alloy (42Ni—Fe alloy), 194 alloy (2.35%Fe-0.12%Zn-0.03%P—Cu alloy) and low thermal expansion kovar (e.g., 31%Ni-14%Co—Fe alloy, part No. Kv-10 solded by Sumitomo Special Metals Co., Ltd.). The solder 6 was BAg-8(72Ag-28Cu solder). The thermal expansion coefficients of these materials are shown in Table II, and the result of the tensile test is shown in Table III.

TABLE II

| Material of Terminal | Thermal Expansion Coefficient ($\times 10^{-6}/°C$) (R.T. ~ 400° C.) |
|---|---|
| kovar | 4.7 |
| 42 alloy | 5.8 |
| 194 alloy | 17.1 |
| kovar* | 4.1 |

*Low Thermal Expansion Type

TABLE III

| | Sample No. | Material of Terminal | Thickness of Cu Stress Relief Layer (μm) | Joining Strength of Terminal (kg/Terminal) | Mode of Breakage |
|---|---|---|---|---|---|
| Invention | 1 | kovar | 100 | 8.5 | BOT |
| | 2 | 42 alloy | 100 | 8.7 | BOT |
| | 3 | 194 alloy | 100 | 6.0 | BOT |
| | 4 | kovar* | 100 | 8.8 | BOT |
| | 5 | kovar | 50 | 6.5 | SOB |
| | 6 | 42 alloy | 50 | 7.9 | SOB |
| | 7 | 194 alloy | 50 | 5.8 | BOT |
| | 8 | kovar* | 50 | 8.7 | BOT |
| | 9 | kovar | 25 | 4.5 | SOB |
| | 10 | 42 alloy | 25 | 4.8 | SOB |
| | 11 | 194 alloy | 25 | 5.8 | BOT |
| | 12 | kovar* | 25 | 5.2 | SOB |
| Comparative Example | 13 | kovar | 10 | 2.1 | SOB |
| | 14 | 42 alloy | 10 | 2.4 | SOB |
| | 15 | 194 alloy | 10 | 3.6 | SOB |
| | 16 | kovar* | 10 | 2.8 | SOB |

*Low Thermal Expansion Type
In the Table, BOT represents "Breakage of Terminal" and SOB represents "Scooping out of Base".

From Tables II and III, it will be understood that the thickness of the stress relief layer needs to be 25 μm or more irrespective of which one of the materials submitted to the test is employed for the terminal in order to satisfy the standard value (4 kg or more) of the joining strength of the terminal.

By this, it is revealed that high temperature soldering represented by brazing with silver solder can be successfully employed for those materials of the terminal, provided that the stress relief layer is formed so as to be 25 μm or more thick.

Further, from Table II, it will be understood that the material of the metallic member which can be used for soldering according to the present invention, ranges widely from a copper alloy known as a high thermal expansion alloy to a low thermal expansion alloy.

Further, it will be understood that the thicker the stress relief layer becomes, the more the stress caused by soldering can be relieved, thus making higher the joining strength.

The terminal made of 194 alloy is about 6 kg in the tensile strength of itself, so when the stress relief layer is 25 μm or more "breakage of terminal" occurs and therefore it is supposed that the actual joining strength is further larger.

On the other hand, other terminals are considered to have the tensile strength of about 8.5~9 kg. So, if the stress relief layer is thin, the stress caused by soldering cannot be relieved sufficiently, thus causing, when subjected to stress by the tensile test, the ceramic base to break before the terminal is broken and causing "scooping out of base".

In this respect, in case the stress relief layer is 100 μm, the stress caused by soldering is relieved sufficiently, thus making it possible to attain a joining strength larger than the tensile strength of the terminal of itself.

In case the stress relief layer is 10 μm, it will be seen that the terminal made of any material cannot attain the desired joining strength (4 kg or more).

By this, it is revealed that such a thin relief layer, as described above, corresponds to the prior art and cannot absorb the stress sufficiently and the joining of the terminal with silver solder is not sufficient in strength, that is, in case the stress relief layer is insufficient in thickness or much less there is not provided any stress relief layer and only solder containing copper such as silver solder is used, the terminal of any material cannot attain a desired standard value of the joining strength.

From the samples of sample Nos. 9~16, it is seen that the terminals made of 194 alloy attain a good joining strength as compared with other terminals. This is considered to result from the fact that 194 alloy is soft so that the terminal of itself effects a stress relief action and therefore though it has a larger thermal expansion efficiency than Fe—Ni alloy, which is a relatively harder material, it could resultantly attain a larger joining strength.

By varying the material of the ceramic base substrate, a further search was made for the effect of thermal expansion coefficient.

In this connection, the thickness of the stress relief layer was set to be 100 μm, the soldered I/O terminal 5 was made of 194 alloy, and the solder 6 was BAg-8 (72Ag-28Cu solder). Mode of breakage was defined similarly to Table II.

TABLE IV

| Sample No. | Material | Composition of Base | Sintering Temp. (°C.) | Thermal Expansion Coefficient ($\times 10^{-6}$/°C.) | Joining Strength of Terminal (kg/Terminal) | Mode of Breakage |
|---|---|---|---|---|---|---|
| 1 | Crystallized Glass | Cordierite (ZnO MgO $Al_2O_3$ $SiO_3$) | 900 | 2.0 | 4.5 | SOB |
| 2 | Crystallized Glass | Cordierite (ZnO MgO $Al_2O_3$ $SiO_2$) | 1000 | 3.0 | 6.0 | BOT |
| 3 | Composite Glass | CaO $Al_2O_3$ $SiO_2$ $B_2O_3$ Glass + $Al_2O_3$ | 900 | 4.8 | 6.0 | BOT |

In the Table, BOT represents "Breakage of Terminal" and SOB represents "Scooping out of Base".

In case of the ceramic base (sample No. 1) made of cordierite which is small in thermal expansion coefficient, the difference of thermal expansion coefficient between the base and the terminal is large, so the mode of breakage was "Scooping out of Base", from which it is seen that the thermal stress could not be absorbed sufficiently. However, the desired joining strength equal to or larger than 4 kg was attained, so the sample can be practically used without any problem.

In this instance, it will be easily supposed that if the stress relief layer 3 is made further thicker (for example, 150 μm or 200 μm) a further improved joining strength can be obtained.

On the other hand, it will be seen that other materials (sample Nos. 2 and 3) can attain a sufficient joining strength.

From the foregoing search concerning the embodiment of FIGS. 1A, 1B and 2, it will be understood that the stress relief layer, if its thickness is equal to or larger than 25 μm, can sufficiently absorb the difference of thermal expansion coefficient between the ceramic base and the terminal and the thermal stress caused by the soldering temperature, etc., so that the metallic member of the material ranging from copper alloy having a large thermal expansion efficiency to Ni—Fe alloy having a small thermal expansion efficiency can successfully be joined to the ceramic base and solder ranging widely from low temperature solder to high temperature solder can be used. Further, a ceramic material having such a small thermal expansion efficiency of $\alpha=2.0\times 10^{-6}$/°C. can be used as a material for forming the ceramic base.

Figure 6:
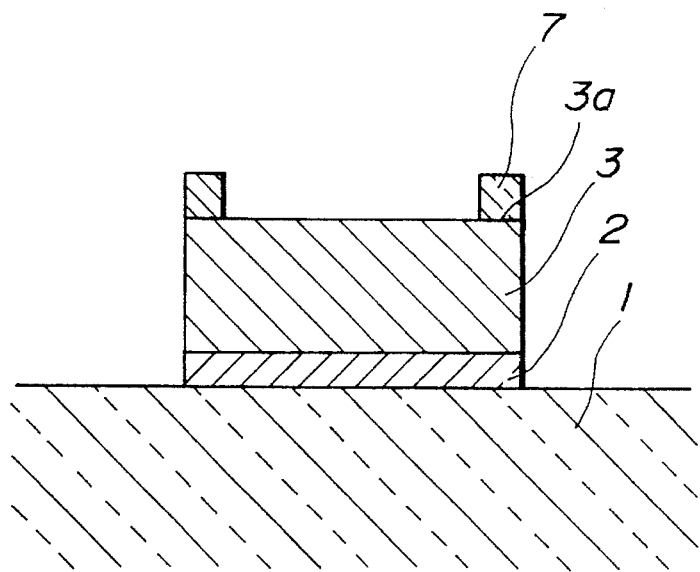
FIG. 6 is a sectional view showing in an exaggerated manner an I/O terminal attaching pad provided at a peripheral portion of a soldering surface thereof with a barrier for preventing flow of solder out of the soldering surface.
Figure 7:
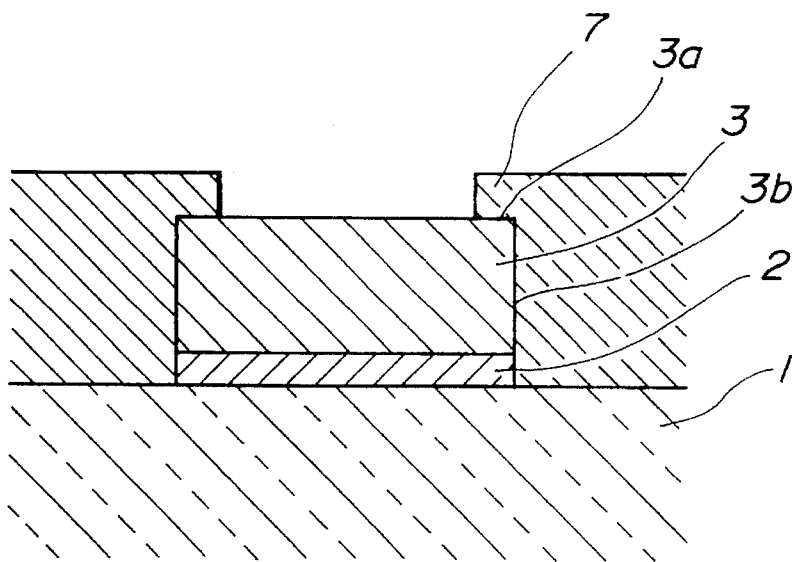
FIG. 7 is a view similar to FIG. 6 but shows a barrier in a condition of being further formed on a ceramic base substrate.
Figure 8:
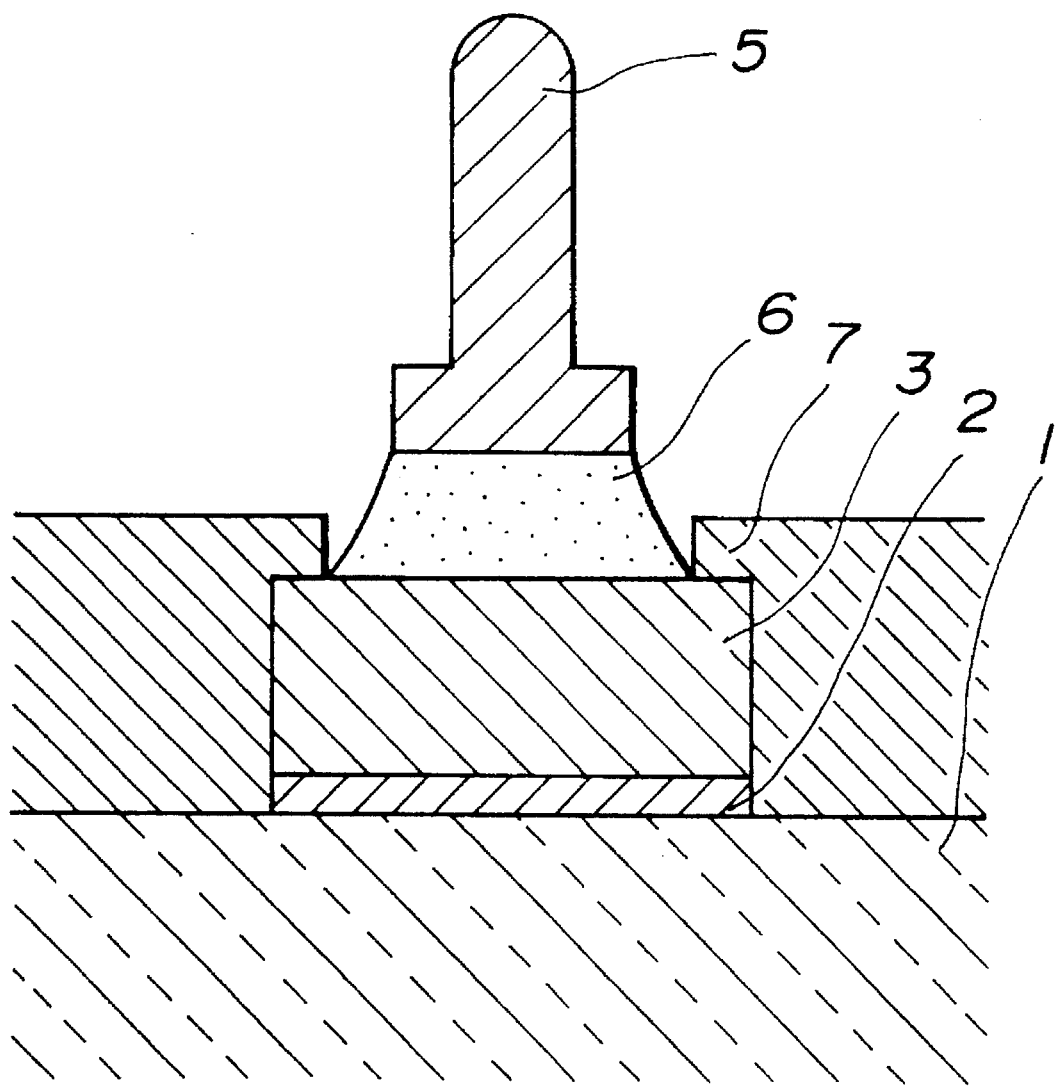
FIG. 8 is a view similar to FIG. 7 but shows the I/O terminal attaching pad in a condition of being joined by solder with an I/O terminal.

Referring now to FIGS. 6 to 8, a further embodiment will be described. In this embodiment, after the stress relief layer 3 is formed by copper plating on the metallized layer 2 made of Ti—Mo—Cu and formed by a spattering process similarly to the previous embodiment of FIGS. 1A, 1B and 2, a barrier 7 for preventing outflow of solder and made of glass is formed on a peripheral portion 3a of the soldering surface of the stress relief layer 3. Thereafter, the terminal 5 is joined by solder 6 to the stress relief layer 3, similarly to the previous embodiment of FIGS. 1A–1B and 2.

The barrier 7 for preventing outflow of solder is formed by first applying glass paste to the entire terminal attaching surface of the ceramic base substrate 1, then baking the glass paste and thereafter removing the glass paste except for a portion located on the peripheral surface 3a of the stress relief layer 3 by the use of photolithography as shown in FIG. 6.

In this connection, the baked glass may be remained not only on the peripheral surface 3a of the stress relief layer 3 but on the ceramic base substrate without being removed therefrom as shown in FIG. 7.

In this embodiment, the diameter of the metallized layer 2 and the stress relief layer 3 is 2.2 mm similarly to the previous embodiment of FIGS. 1A–1B and 2, and the inner diameter of the barrier 7 for preventing outflow of solder is 1.9 mm.

The stress relief layer 3 is plated with nickel similarly to the previous embodiment of FIGS. 1A–1B and 2 and thereafter the barrier 7 for preventing outflow of solder is formed on the stress relief layer 3.

The terminal used in this embodiment is similar to that in the previous embodiment of FIGS. 1A–1B and 2.

In this embodiment, flow of the solder 6 is dammed up by the barrier 7 so that the solder does not flow into the peripheral portion 3a of the stress relief layer 3 so that the soldered structure shown in FIG. 8 is obtained.

In this instance, the stress due to the difference in thermal expansion between the solder 6 and the base ceramic substrate 1 does not occur concetratedly at the peripheral portion 3a of the stress relief layer 3, so that such a stress is not applied to the stress relief layer 3 that urges the stress relief layer 3 to be pulled off from the metallized layer 2 and finally from the ceramic base substrate 1, thus making it possible to increase the joining strength for thereby obtaining a stable joining condition and resultantly making it possible to obtain an assured and reliable joining strength of terminal.

In connection with this embodiment, various samples were prepared in which terminals 5 are made of different materials and joined to the stress relief layer 3 with solder 6 and a tensile test similar to that described with respect to the previous embodiment of FIGS. 1A–1B and 2 was made for comparing the samples with respect to the relation between the thickness of the stress relief layer and the joining strength. The materials for the terminal 5 were four, i.e., kovar (Fe—Ni—Co alloy), 42 alloy (42Ni—Fe alloy), and low thermal expansion type kovar. The solder 6 was BAg-8(72Ag-28Cu solder). The result of the test is shown in Table V.

In the meantime, in this embodiment, not only the initial joining stress but the joining stress after 1000 cycles of a thermal shock test by means of MIL-STD-883, Cond. C was evaluated.

The effect of the barrier 7 is apparent from the comparison of the joining strength between the group of samples of sample Nos. 13~16 and the group of samples of sample Nos. 17~20. That is, although the thickness of the stress relief layer 3 is 10 μm, a considerably increased joining strength can be attained by the provision of the barrier 7.

TABLE V

| | Sample No. | Material of Terminal | Thickness of Cu Stress Relief Layer (μm) | Barrier | Early Time after Joining | | After 1000 cycles of Thermal Shock Test | |
|---|---|---|---|---|---|---|---|---|
| | | | | | Joining Strength of Terminal (kg/Terminal) | Mode of Breakage | Joining Strength of Terminal (kg/Terminal) | Mode of Breakage |
| Invention | 1 | kovar | 100 | Yes | 9.0 | BOT | 8.8 | BOT |
| | 2 | 42 alloy | 100 | Yes | 9.0 | BOT | 8.8 | BOT |
| | 3 | 194 alloy | 100 | Yes | 6.2 | BOT | 6.0 | BOT |
| | 4 | kovar | 100 | Yes | 9.3 | BOT | 9.0 | BOT |
| | 5 | kovar | 50 | Yes | 7.0 | SOT | 6.8 | SOB |
| | 6 | 42 alloy | 50 | Yes | 8.2 | SOT | 7.9 | SOB |
| | 7 | 194 alloy | 50 | Yes | 6.0 | BOT | 5.8 | BOT |
| | 8 | kovar* | 50 | Yes | 8.8 | BOT | 8.5 | BOT |
| | 9 | kovar | 25 | Yes | 4.9 | SOB | 4.8 | SOB |
| | 10 | 42 alloy | 25 | Yes | 5.2 | SOB | 5.0 | SOB |
| | 11 | 194 alloy | 25 | Yes | 5.8 | BOT | 5.5 | BOT |
| | 12 | kovar* | 25 | Yes | 5.8 | SOB | 5.0 | SOB |
| | 13 | kovar | 10 | Yes | 4.2 | SOB | 4.0 | SOB |
| | 14 | 42 alloy | 10 | Yes | 4.4 | SOB | 4.1 | SOB |
| | 15 | 194 alloy | 10 | Yes | 4.4 | SOB | 4.2 | SOB |
| | 16 | kovar* | 10 | Yes | 4.4 | SOB | 4.2 | SOB |
| Comparative Example | 17 | kovar | 10 | NO | 2.1 | SOB | 1.0 | SOB |
| | 18 | 42 alloy | 10 | NO | 2.4 | SOB | 1.0 | SOB |
| | 19 | 194 alloy | 10 | NO | 3.6 | SOB | 3.0 | SOB |
| | 20 | kovar* | 10 | NO | 2.8 | SOB | 1.4 | SOB |

*Low Thermal Expansion Type
In the Table, BOT represents "Breakage of Terminal", SOB represents "Scooping out of Base", YES represents "barrier is provided" and NO represents "barrier is not provided".

Further, it is the same to the result of the test with respect to the previous embodiment of FIGS. 1A–1B and 2 that in case the thickness of the stress relief layer 3 is equal to or larger than 25 μm the joining strength becomes larger than the standard value (refer to Table III). Furthermore, from the comparison between Table V and Table III, it will be seen that the embodiment provided with the barrier 7 can be higher in the joining strength at an early time after joining and also higher even after the thermal shock test as compared with those in Table III which are the joining strengths at the early time after joining.

Accordingly, by a barrier for preventing outflow of solder, provided upon the stress relief layer, not only a higher joining stress can be attained but the joining strength can be maintained even after the thermal shock test, thus making it possible to attain an assured and reliable joining assembly.

In the meantime, the material for the barrier 7 can suffice if it posses a property of repelling solder, i.e., a property of being unwetted by solder and therefore can be other than glass. Accordingly, an organic insulation material having such a heat resistivity that can endure the temperature at the time of soldering can be used in place therefor, for example, polyimide and epoxy resin. These materials are low in heat resistivity as compared with glass and therefore used in case of low temperature soldering by gold solder, etc.

In the foregoing, it will be noted that a ceramic base substrate has been described and shown as being made of glass ceramic for the purpose of illustration only and may be made of another ceramic material including aluminium nitride, mullite, cordierite, silicon nitride, boron nitride or the like as a major constituent, provided that its thermal expansion efficiency is equal to or smaller than $5\times10^{-6}/°C$.

It will be further noted that the metallized layer which has been described as being formed by spattering, may be formed by another method such as a method of applying paste containing copper, gold, silver, tungsten, molybdenum, or the like to a green ceramic base substrate and cofiring them, a method of printing silver palladium paste, etc. on a fired ceramic base substrate and thereby forming a thick film layer thereon, vapor deposition, electroless plating, etc.

It will be further noted that the stress relief layer can produce a sufficient effect, provided that its thickness is equal to or larger than 25 μm but a thicker one is more desirable. Accordingly, on the consideration of an economical reason, restrictions of shape and size, solder, soldering condition, etc., the thickness of the stress relief layer can be set at a suitable value, and it is supposed that a preferable thickness is within the range of 25~100 μm and the more preferable thickness is within the range of 50~100 μm.

It is further to be noted that the stress relief layer having been described in the above as being made of copper, may be made of another soft metal such as gold, silver, iron, aluminium, platinum, palladium, nickel, etc.

It is further to be noted that if, in case of forming a nickel layer on the stress relief layer, a gold layer is further formed on the nickel layer by plating the better joining can be obtained in case of joining with gold solder.

It is further to be noted that the material of the metallic member (i.e., terminal) is not limited to those described in the foregoing embodiments, that is, it will be apparent that the present invention is useful for any material forming a metallic member and of a thermal expansion efficiency within a wide range and is not limited to a particular one.

It is further to be noted that while the metallic member to be joined to the ceramic base substrate has been described and shown as being an I/O terminal, it may be a metallic seal ring 5', as shown by two-dot chain lines in FIG. 2, which is joined by a correspondingly shaped metallized layer 2', stress relief layer 3' and solder layer 6' to the ceramic base 1 and to which a lid is joined for hermetic sealing of the package. In joining of the seal ring which is a metallic member to the ceramic base, a metallized layer and a stress relief layer are formed on the joining portion of the ceramic base and the seal ring which is a metallic member is joined by solder to the stress relief layer.

It will be further noted that an I/O terminal has been described and shown as being a pin-type it may be a reed-type.

From the foregoing, it will be understood that by the provision of a stress relief layer of the thickness equal to or larger than 25 μm in the joining of a metallic member to a ceramic base substrate according to the present invention it becomes possible to carry out high-temperature soldering with silver solder, etc. which, according to the prior art, has been impossible to attain a sufficient joining strength. This is because the stress relief layer made of soft metal is effective of relieving the thermal stress caused at the joint between the metallic member and the ceramic base substrate. Particularly, in case of combination of a ceramic base substrate made of low thermal expansion ceramic and a metallic member having a thermal expansion coefficient larger than that of the ceramic base substrate, the stress relief layer can relieve the tensile stress caused in the ceramic base substrate and prevent breakage of the ceramic base substrate due to stress.

It will be further understood that by the provision of a barrier for preventing outflow of solder according to the present invention it becomes possible to attain a further increased and reliable joining strength. When solder flows into the peripheral portion of the soldering surface of the stress relief layer and further into the metallized layer, stress is caused concentratedly at the peripheral portion of the soldering surface of the stress relief layer, thus reducing the effect of the stress relief layer. By the provision of the barrier made of glass or an organic insulating material at the peripheral portion of the stress relief layer, solder is prevented from flowing into the peripheral portion of the soldering surface of the stress relief layer and thereby preventing concentration of the stress thereat, thus making it possible to further increase the stress relieving effect by the stress relief layer.

It will be further understood that by the application of the present invention to the joining of I/O terminals and a ceramic base substrate it becomes possible to obtain a ceramic base having a large joining strength at the joint between the terminals and the base, thus making it possible to obtain a highly reliable ceramic base.

It will be further understood that by the application of the present invention to the joining of a seal ring and a ceramic base substrate it becomes possible to obtain a ceramic base having a large joining strength at the joint between the seal ring and the base, thus making it possible to obtain a ceramic base which can be hermetically sealed with assuredness.

What is claimed is:

1. A ceramic base comprising:
a ceramic base substrate made of a ceramic material having a thermal expansion coefficient equal to or smaller than $5\times10^{-6}/°C.$;
a metallized layer formed on said ceramic base substrate; and
a stress relief layer made of soft metal, formed directly on said metallized layer and having a thickness equal to or larger than 25 μm.

2. A ceramic base comprising:
a ceramic base substrate made of a ceramic material having a thermal expansion coefficient equal to or smaller than $5\times10^{-6}/°C.$;
a metallized layer formed on said ceramic base substrate;
a stress relief layer made of soft metal, formed on said metallized layer and having a thickness equal to or larger than 25 μm; and
a nickel layer formed on said stress relief layer.

3. A ceramic base and metallic member assembly comprising:
a ceramic base substrate made of a ceramic material having a thermal expansion coefficient equal to or smaller than $5\times10^{-6}/°C.$;
a metallized layer formed on said ceramic base substrate;
a stress relief layer made of soft metal, formed on said metallized layer and having a thickness equal to or larger than 25 μm;
a solder layer formed on said stress relief layer; and
a metallic member joined by said solder layer to said stress relief layer.

4. A ceramic base and metallic member assembly according to claim 3, further comprising a barrier for preventing outflow of solder, formed on a peripheral portion of a joining surface of said stress relief layer.

5. A ceramic base and metallic member assembly according to claim 4, wherein said barrier is made of glass.

6. A ceramic base and metallic member assembly according to claim 4, wherein said barrier is made of an organic insulating material.

7. A ceramic base and metallic member assembly according to claim 3, wherein said stress relief layer is plated.

8. A ceramic base and metallic member assembly according to claim 3, wherein said metallic member is an input/output terminal.

9. A ceramic base and metallic member assembly according to claim 3, wherein said metallic member is a seal ring.

10. An electronic device comprising: a ceramic base substrate made of ceramic material having a thermal expansion coefficient equal to or smaller than $5\times10^{-6}/°C.$;
a metallized layer formed on a ceramic base substrate;
a stress relief layer made of soft metal, formed on said metallized layer and having a thickness equal to or larger than 25 μm;
a solder layer formed on said stress relief layer; and
a metallic member joined by said solder layer to said stress relief layer.

11. A ceramic base and metallic member assembly for an electronic device comprising:
a ceramic base substrate made of a ceramic material having a thermal expansion coefficient equal to or smaller than $5\times10^{-6}/°C.$;
a metallized layer formed on said ceramic base substrate;
a stress relief layer made of soft metal, formed on said metallized layer and having a thickness within the range from 25 to 100 μm;
a solder layer formed on said stress relief layer; and
a metallic member joined by said solder layer to said stress relief layer.

12. A ceramic base and metallic member assembly for an electronic device comprising:
a ceramic base substrate made of a ceramic material having a thermal expansion coefficient equal to or smaller than $5\times10^{-6}/°C.$;
a metallized layer formed on said ceramic base substrate;
a stress relief layer made of soft metal, formed on said metallized layer and having a thickness within the range from 50 to 100 μm;

a solder layer formed on said stress relief layer; and a metallic member joined by said solder layer to said stress relief layer.

13. A ceramic base according to claim 1, wherein said stress relief layer is plated.

14. A ceramic base according to claim 1, wherein said soft metal is copper.

15. A ceramic base according to claim 1, wherein said soft metal is selected from copper, gold, silver, iron, aluminum, palladium, and nickel.

16. A ceramic base according to claim 2, wherein said stress relief layer is plated.

17. A ceramic base according to claim 2, wherein said soft metal is copper.

18. A ceramic base according to claim 2, wherein said soft metal is selected from copper, gold, silver, iron, aluminum, palladium, and nickel.

19. A ceramic base and metallic member assembly according to claim 3, wherein said soft metal is selected from copper, gold, silver, iron, aluminum, palladium, and nickel.

20. A ceramic base and metallic member assembly according to claim 3, wherein said soft metal is copper.

* * * * *